United States Patent [19]

Hahn et al.

[11] Patent Number: 4,674,173
[45] Date of Patent: Jun. 23, 1987

[54] METHOD FOR FABRICATING BIPOLAR TRANSISTOR

[75] Inventors: Larry A. Hahn, Richardson; Robert H. Havemann, Garland, both of Tex.

[73] Assignee: Texas Instruments Incorporated, Dallas, Tex.

[21] Appl. No.: 750,397

[22] Filed: Jun. 28, 1985

[51] Int. Cl.[4] .................... H01L 21/31; H01L 21/76
[52] U.S. Cl. .............. 29/576 B; 29/576 W; 29/578; 148/1.5; 148/175; 357/34
[58] Field of Search .............. 29/576 B, 578, 576 W; 148/1.5, 175; 357/34

[56] References Cited

U.S. PATENT DOCUMENTS

| | | | |
|---|---|---|---|
| 4,378,630 | 4/1983 | Horng et al. | 29/580 |
| 4,400,715 | 8/1983 | Barbee et al. | 357/49 |
| 4,509,249 | 4/1985 | Goto et al. | 29/576 W |
| 4,546,538 | 10/1985 | Suzuki | 29/576 W |
| 4,549,927 | 10/1985 | Goth et al. | 29/576 W |
| 4,582,565 | 4/1986 | Kawakatsu | 156/643 |

OTHER PUBLICATIONS

Nakamura et al, IEEE-Trans. Electron Devices, ED-32 (1985), 248.
Malaviya, S. D., IBM-TDB, 24 (1982), 5578.

*Primary Examiner*—Upendra Roy
*Attorney, Agent, or Firm*—Douglas A. Sorensen; Kenneth C. Hill; Melvin Sharp

[57] ABSTRACT

One embodiment of the present invention provides a method whereby a symmetrical transistor may be fabricated which eliminates the problems of scalability caused by the requirement of fabricating an extrinsic base. The method accomplishes this by the use of a polysilicon extrinsic base structure which is formed in a trench containing an insulating layer in the bottom of the trench formed by differential oxidation.

After fabricating appropriate isolation structures, two trenches for either side of the intrinsic base are cut into the surface of the substrate. The bottom of these trenches are then heavily doped. A silicon dioxide layer is then thermally grown in the trenches. Because the bottoms of the trenches are heavily doped, a thicker silicon dioxide layer is formed in the bottom of the trenches. This silicon dioxide layer is then etched so that the silicon dioxide layer is completely removed from the sides of the trench but remains in the bottoms of the trench. The trenches are then filled with polycrystalline silicon. After the fabrication of the intrinsic base, the emitter and the contact to a subcollector, dopant ions are implanted into the polycrystalline silicon extrinsic base thereby heavily doping the extrinsic base. This implantation is driven in which causes a P+ region to be formed on the edges of the intrinsic base thus providing good contact between polycrystalline silicon extrinsic base and the intrinsic base. Because this implantation is performed as one of the last steps in fabricating the transistor, the undesirable effects of out diffusion of the extrinsic base are eliminated.

18 Claims, 12 Drawing Figures

METHOD FOR FABRICATING BIPOLAR TRANSISTOR

FIELD OF THE INVENTION

The present invention relates to the field of semiconductor device technology. More specifically, the present invention relates to the field of bipolar transistor fabrication.

BACKGROUND OF THE INVENTION

A common goal in the fabrication of bipolar transistors, particularly in the fabrication of bipolar transistors in integrated circuits, is the fabrication of a transistor having a minimum capacitance between the base, emitter and collector. To this end, symmetrical transistors have been developed. A symmetrical transistor is one in which the interface area between the base and the emitter is approximately equal to the interface area between the base and collector. However, prior art techniques for fabricating a device of this type include complex alignment steps and/or difficult procedures such as the implantation of oxygen as disclosed in co-pending application Ser. No. 696,378, filed May 16, 1985, which is assigned to the assignee of this application.

Another problem in the fabrication of bipolar transistors is the problem of scalability. It is a desirable feature of a process for fabricating bipolar transistors that the process be capable of fabricating smaller and smaller transistors as lithography techniques for patterning these transistors on the surface of integrated circuits improves. However, using prior art techniques, a problem occurs providing ohmic contacts to the base of the transistors. For maximum performance of a bipolar transistor, the emitter must be heavily doped and the base lightly doped. In order to provide an ohmic contact to the base, a heavily doped region (extrinsic base) contiguous with the lightly doped (intrinsic base) region must be provided. This follows from the requirement that good ohmic contacts may only be made to heavily doped regions. However, after these heavily doped base contact regions are formed in the integrated circuit, subsequent processing steps involving heating will cause the extrinsic base to diffuse outward. This may cause the base region to be more heavily doped than desired or may partially counterdope the emitter of the transistor. This effect is negligible in larger transistors but creates large problems in one micron and submicron devices.

SUMMARY OF THE INVENTION

One embodiment of the present invention provides a process whereby a symmetrical transistor may be fabricated which eliminates the problems of scalability caused by the requirements of fabricating an extrinsic base. The method accomplishes this by the use of a polysilicon extrinsic base structure which is formed in a trench containing an insulating layer in the bottom of the trench. This insulating layer is formed using a differential oxidation method.

After fabricating appropriate isolation structures, a trench surrounding the intrinsic base is cut into the surface of the substrate which will contain the bipolar transistor. The bottom of these trenches are then heavily doped. A silicon dioxide layer is then thermally grown in the trenches. Because the bottoms of the trenches are heaviy doped, a thicker silicon dioxide layer is formed in the bottom of the trenches. This silicon dioxide layer is then etched so that the silicon dioxide layer is completely removed from the sides of the trench but remains in the bottoms of the trench. The trenches are then filled with polycrystalline silicon. After the fabrication of the intrinsic base, the emitter and the contact to a subcollector, dopant ions are implanted into the polycrystalline silicon extrinsic base thereby heavily doping the extrinsic base. This implantation is driven in and causes a heavily doped region to be formed on the edges of the intrinsic base thus providing good contact between the polycrystalline silicon extrinsic base, and the intrinsic base. Because this implantation is performed as one of the last steps in fabricating the transistor, the undesirable effects of out diffusion of the extrinsic base are minimized.

DETAILED DESCRIPTION

Figure 1A:
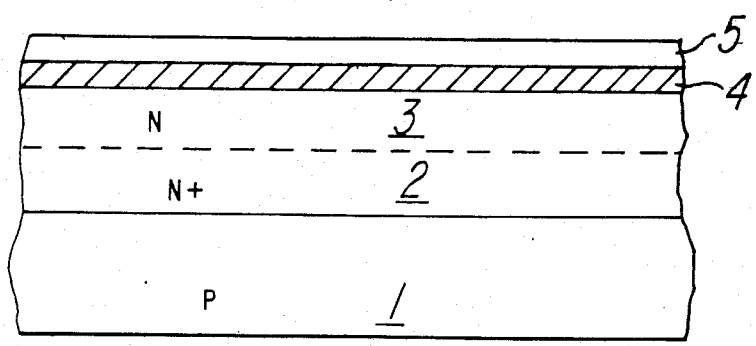
FIGS. 1A through 1C are side view schematic drawings depicting the fabrication steps necessary to provide the isolation structure for one embodiment of the present invention.
Figure 1B:
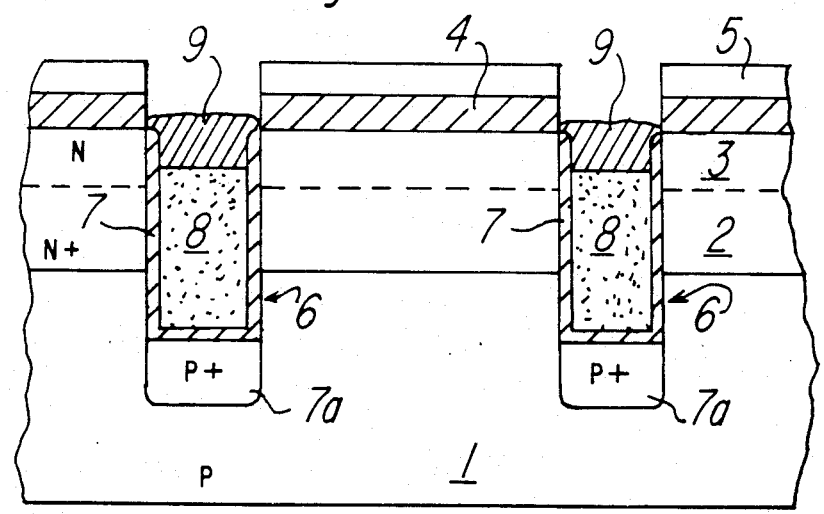

FIGS. 1A through 1D are schematic side views depicting the processing steps necessary to fabricate the isolation structure used in one embodiment of the present invention. N+ subcollector 2 and N layer 3 are formed on the surface of P type substrate 1 using techniques well known in the art. Silicon dioxide layer 4 (approximately 350 Angstroms thick) and silicon nitride layer 5 (approximately 1200 Angstroms thick) are then formed on the surface of N type layer 3 using techniques well known in the art. Silicon nitride layer 5 and silicon dioxide layer 4 are then patterned to provide a mask to etch trenches 6 through N type layer 3, N+ layer 2 and into P type substrate 1 as shown in FIG. 1B. Silicon dioxide layers 7 are then grown by thermal oxidation to a thickness of approximately 1500 angstroms. A vertical ion implantation of boron ions is then performed having an energy of approximately 50 kiloelectron volts and a density of approximately $8 \times 10^{13}$ ions/cm2 to provide channel stop regions 7A. Trenches 6 are then filled with polycrystalline silicon deposited by chemical vapor deposition which is then etched back until the top surface of polycrystalline silicon plugs 8 is just below the surface N type layer 3. The top of polycrystalline plugs 8 are then thermally oxidized to provide silicon dioxide caps 9 at the mouth of trenches 6. This provides a region between trenches 6 which is completely isolated from other devices fabricated in N type layer 3 and N+ layer 2. Thus trenches 6 provide isolaton and pattern N+ layer 2 into a subcollector during the same operation. In addition, the use of trench isolation avoids the problem sideways growth of the isolation oxide known as a "bird's beak".

Silicon nitride layer 5 and silicon dioxide layer 4 are then removed using techniques well known in the art. The structure of FIG. 1B is then subjected to a thermal oxidation to provide silicon dioxide layer 13 which is approximately 350 angstroms thick. Silicon nitride layer 10 is then deposited on the surface of silicon diodixe layer 13 and patterned to provide an oxidation mask. A recessed LOCOS process is then performed to provide thick, planar silicon dioxide layers 11 and subcollector contact isolation plug 12. Silicon nitride layer 10 is then removed using techniques well known in the art.

Figure 1C:
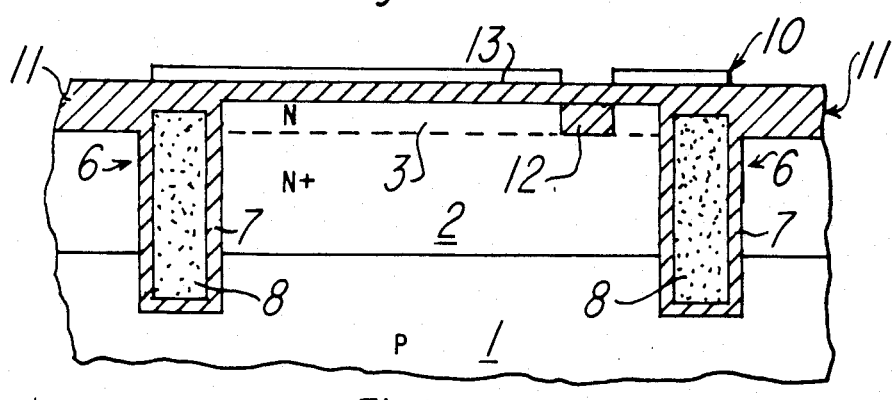
Figure 2A:
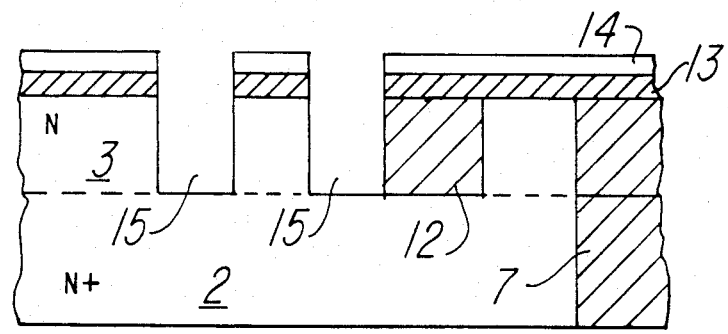
FIGS. 2A through 2H are side view schematic drawings of a subsection of the structure shown in FIGS. 1A through 1D depicting the processing steps necessary to fabricate one embodiment of the invention.
Figure 2B:
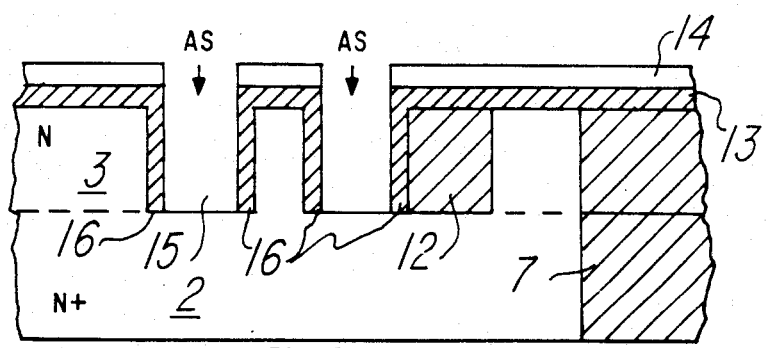
Figure 2C:
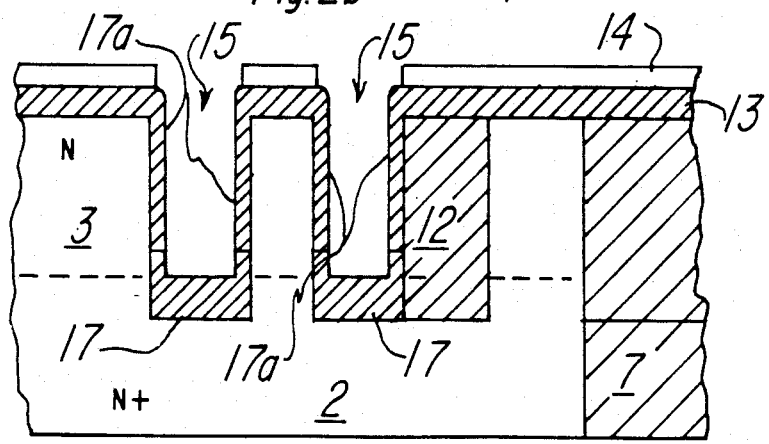
Figure 2D:
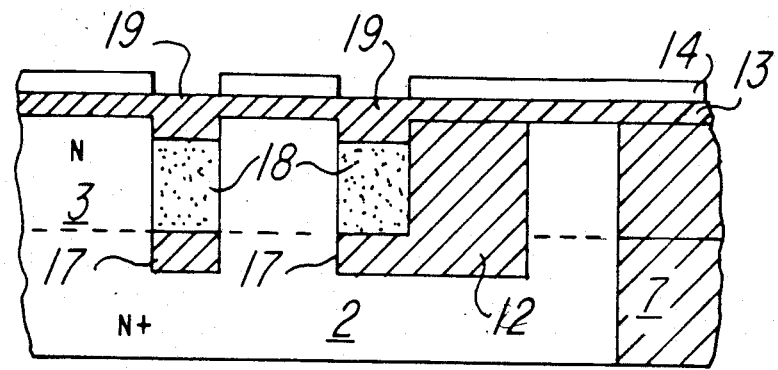

FIG. 2A is a side view schematic diagram of a subsection of the structure shown in FIG. 1C. Silicon nitride layer 14 is deposited on the surface of silicon dioxide layer 13 using techniques well known in the art. Silicon nitride layer 14, silicon dioxide layer 13, N layer 3 and N+ layer 2 are then patterned and etched to provide trench 15. This etch is performed using a process which provides an etching ratio between silicon and silicon dioxide of 1 to 1. This allows the portion of trench 15 which is etched through silicon dioxide plug 12 to have the same depth and profile as that through N layer 3. The structure of FIG. 2A is then subjected to a thermal oxidation process which forms silicon dioxide layers 16 having a thickness of approximately 1,000 angstroms. The portion of silicon dioxide layers 16 in the bottom of trench 15 is removed using an anisotropic etching process to provide the structure shown in FIG. 2B. The structure of FIG. 2B is then subjected to an implantation of arsenic ions having a density of approximately $2 \times 10^{16}$ ions per centimeter squared and an energy of approximately 80 kiloelectron volts. This ion implantation is then annealed to heavily dope the bottoms of trench 15. Silicon dioxide layer 16 is then removed by wet chemical etching. The structure of FIG. 2B is then subjected to a further thermal oxidation step at 800 degrees C. in a steam ambient to oxidize the surfaces of trench 15 to provide thick oxide regions 17 and thin oxide regions 17A as shown in FIG. 2C. Because the bottom of trench 15 is heavily doped, silicon dioxide layers 16 will be much thicker than silicon dioxide layers 17A due to differential oxidation growth. Silicon dioxide layers 17A are then removed using a chemical etching process. Because silicon dioxide layers 17 are thicker than silicon dioxide layers 17A, silicon dioxide layers 17A may be removed without completely removing silicon dioxide layers 17. Polycrystalline silicon plugs 18 of FIG. 2D are then formed by depositing a layer of polycrystalline silicon on the surface of the structure of FIG. 2C using chemical vapor deposition and anisotropically etching back the deposited layer of polycrystalline silicon material. The surface of polycrystalline silicon plugs 18 is then thermally oxidized to provide silicon dioxide caps 19 as shown in FIG. 2D.

Figure 2E:
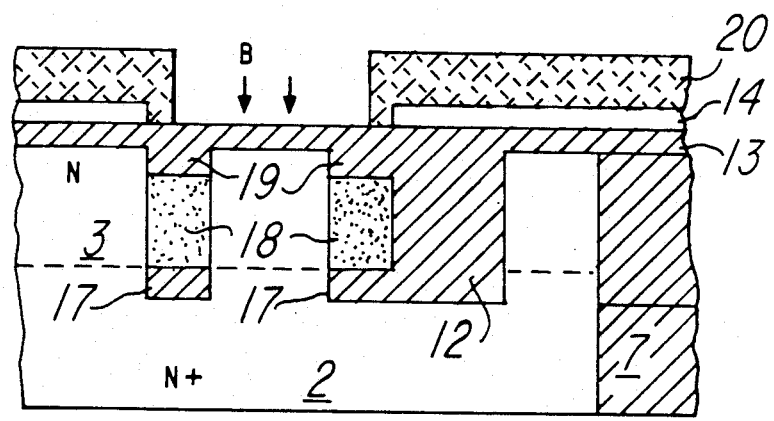
Figure 2F:
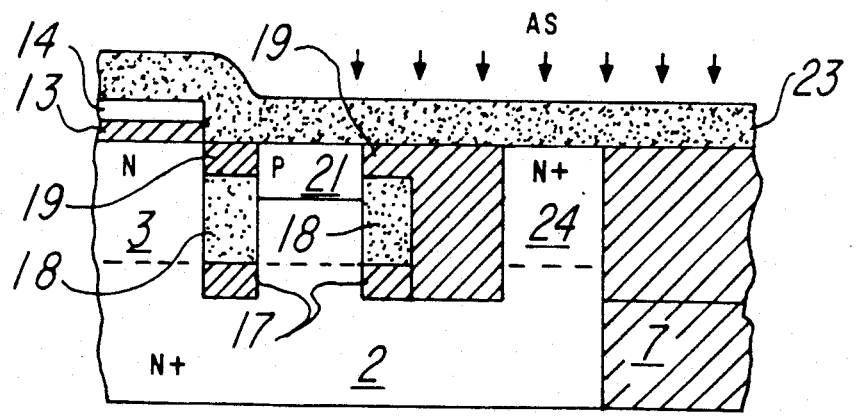
Figure 2G:
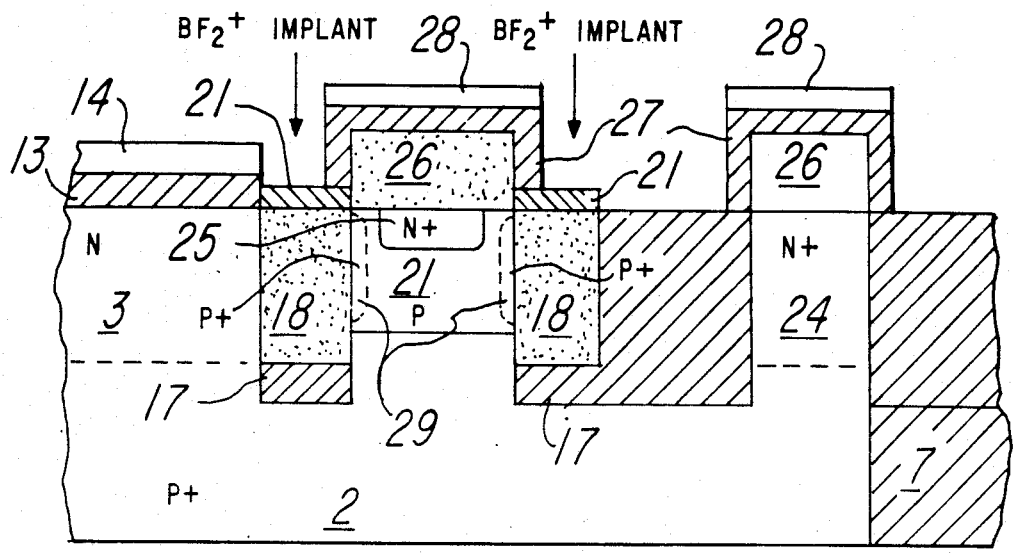

Photoresist layer 20 is then deposited on the surface of the structure of FIG. 2D and patterned as shown in FIG. 2E. The portion of silicon nitride layer 14 which is not covered by photoresist layer 20 is then removed using an etching technique which is selective to oxide. The structure of FIG. 2E is then subjected to an implantation of boron ions having density of approximately $4.5 \times 10^{13}$ ions per centimeter squared and an energy of approximately 50 kiloelectron volts. This ion implantation provides the intrinsic base 21 as shown in FIG. 2F. Photoresist layer 20 is then removed and another photoresist layer (not shown) is formed and patterned to provide a mask for etching the portions of silicon nitride layer 14 and silicon dioxide layer 13 over the portions of N layer 3 which will serve as the emitter and subcollector contact. These portions are then removed using techniques well known in the art to provide the structure shown in FIG. 2F. A photoresist layer (not shown) is then formed and patterned to provide a mask for implanting Phosphorus ions into the region between isolation region 7 and silicon dioxide plug 12 to form a deep N+ collector 24 and this implantation is performed using an ion density of approximately $5 \times 10^{15}$ and an energy of approximately 150 kiloelectron volts. Polycrystalline silicon layer 23 is then deposited using chemical vapor deposition to a thickness of approximately 2500 angstroms. Polycrystalline silicon layer 23 is then heavily doped by an arsenic ion implantation having a density of approximately $2 \times 10^{16}$ ions per centimeter squared and an energy of approximately 80 kiloelectron volts. The doping of polycrystalline silicon layer 23 provides dopant atoms for subcollector contact 24 and emitter 25 (FIG. 2G). A layer of silicon dioxide 27 is deposited on the surface of polycrystalline silicon layer 23 using chemical vapor deposition to a thickness of approximately 500 angstroms. A layer of silicon nitride 28 is then deposited on the surface of this silicon dioxide layer 27 using chemical vapor deposition to a thickness of approximately 1400 angstroms. The silicon nitride layer 28, silicon dioxide layer 27 and polycrystalline silicon layer 23 are then patterned and etched to provide polysilicon emitter amd collector regions 26. Polycrystalline silicon caps 19 are then etched to expose polycrystalline silicon plugs 18 as shown in FIG. 2G. (Note: silicon nitride layer 14 must be thick enough to remain after this etch) The photoresist layer (not shown) is then removed. The sidewalls of poly emitter and collector regions 26 are then thermally oxidized using a low temperature (800 degrees C.) thermal oxidation to provide thick sidewall oxide layers 22 and thin oxide layers 21 (approximately 200 Angstroms thick) using differential oxidation. The structure of FIG. 2G is then subjected to an ion implantation of boron difluoride ions having a density of approximately $1 \times 10^{15}$ ions per centimeter squared and an energy of approximately 60 kiloelectron volts. This ion implantation is annealed to provide P+ regions 18 and 29 as shown in FIG. 2G.

Thus an extrinsic base structure which provides a lightly doped base for optimal performance of the transistor and heavily doped extrinsic base contacts for good ohmic contact to the base is provided by doping an extrinsic base in one of the last steps of the fabrication of the transistor. Therefore, the diffusion of dopant ions from the extrinsic base to other regions of the integrated circuit is minimized thus improving the scalability of this embodiment of the invention.

Figure 2H:
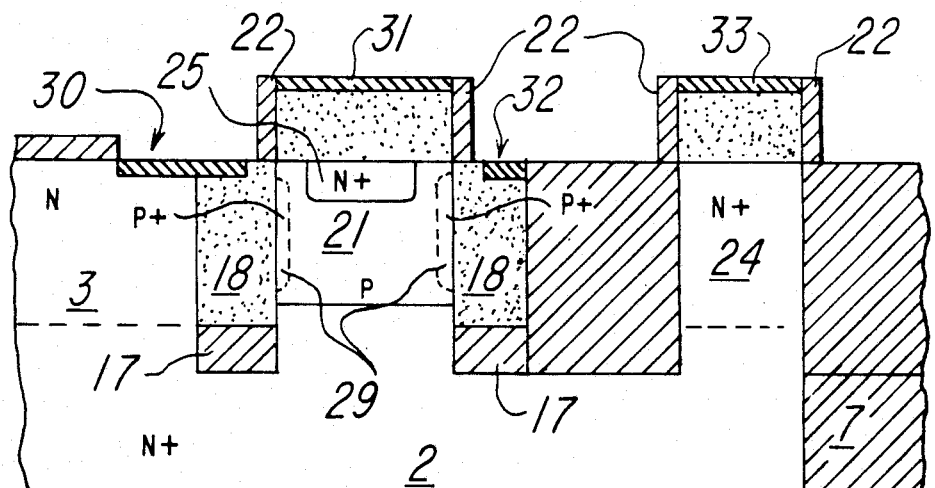

In another embodiment of the present invention, silicon nitride layers 28 and 14 are removed using techniques well known in the art. Silicon dioxide layer 13 is then patterned and etched using an anisotropic etching process to pattern silicon dioxide layer 13 and remove silicon dioxide layers 21 and 27 while not removing sidewall oxide layers 22. A layer of refractory metal, for example platinum, is then deposited on the entire surface of the integrated circuit. The integrated circuit is then heated to react the metal with the silicon not covered by silicon dioxide. This provides silicide 30, 31, 32 and 33 as shown in FIG. 2H. The unreacted metal is then removed using techniques well known in the art. This procedure is particularly useful in providing Schottky transistor logic (STL) elements. In FIG. 2H, metal silicide layer 30 contacts both extrinsic base 18 and N type layer 3. Metal silicide layer 30 thus provides an ohmic contact to extrinsic base 30 and a Schottky barrier contact to N type layer 3 to form a Schottky diode thus providing a subcollector Schottky clamp between the base and collector of transistor 40 which is self aligned to the extrinsic base. In addition, metal silicide layers 31 provide improved contact to the base collector and emitter and provide lower sheet resistance.

Figure 3:
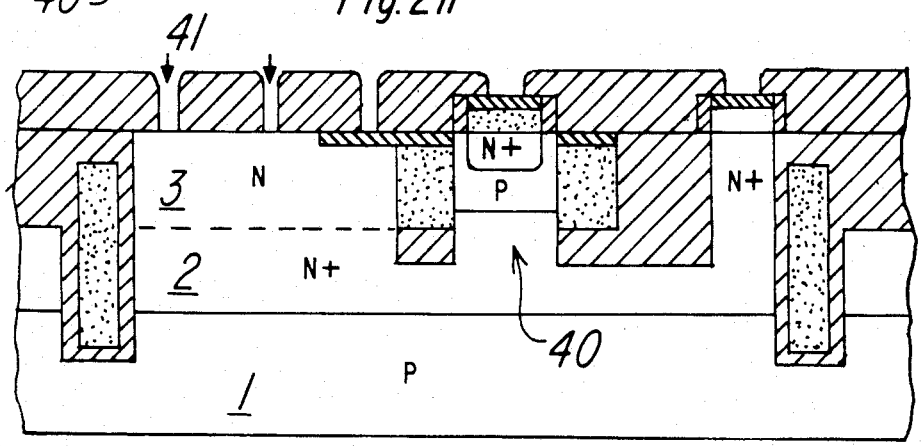
FIG. 3 is a side view schematic drawing depicting one embodiment of the present invention utilized as a Schottky transistor logic (STL) cell.

FIG. 3 is a side view schematic diagram of a Schottky transistor logic cell fabricated in accordance with one embodiment of the present invention including the low barrier Schottky diodes, such as titanium disilicide, formed in openings 41.

Although this specification contains specific embodiments of the present invention, it is not to be construed as limiting the scope of the invention. Other embodiments of the present invention will become obvious to those skilled on the art in light of the teachings of this specification. The scope of the invention is limited only by the claims appended hereto.

We claim:

1. A process for fabricating a bipolar transistor, comprising the steps of:
   providing a substrate having a first region of a first conductivity type serving as a collector;
   etching a depression into said first region;
   forming an insulating layer in the bottom of said depression;
   filling said depression with an electrically conductive material;
   forming a second region having a second conductivity type in said first region adjacent to said depression, said second region serving as a base;
   forming a third region of said first conductivity type serving as an emitter in said second region; and
   then implanting dopant ion into said conductive material.

2. A process as in claim 1 further including the step of annealing said implanted of dopant ions.

3. A process as in claim 1 wherein said conductive material is polycrystalline silicon.

4. A process as in claim 1 wherein said step of forming insulating material in the bottom of said depression is accomplished by the steps of:
   implanting dopant ions into the bottom of said depression;
   forming a layer of silicon dioxide on the surface of said depression by thermal oxidation; and
   etching said layer of silicon dioxide to completely remove the portions of said silicon dioxide layer on the sides of said depression but not completely remove the portion of said silicon dioxide layer in the bottom of said depression.

5. A process as in claim 1 wherein said dopant ion is boron difluoride.

6. A process as in claim 2 wherein said conductive material is polycrystalline silicon.

7. A process as in claim 2 wherein said step of forming insulating material in the bottom of said first and second trenches is accomplished by the steps of:
   implanting dopant ions into the bottom of said depression;
   forming a layer of silicon dioxide on the surface of said depression by thermal oxidation; and
   etching said layer of silicon dioxide to completely remove the portions of said silicon dioxide layer on the sides of said depression but not completely remove the portion of said silicon dioxide layer in the bottom of said depression.

8. A process as in claim 3 wherein said step of forming insulating material in the bottom of said first and second trenches is accomplished by the steps of:
   implanting dopant ions into the bottom of said depression;
   forming a layer of silicon dioxide on the surface of said depression by thermal oxidation; and
   etching said layer of silicon dioxide to completely remove the portions of said silicon dioxide layer on the sides of said depression but not completely remove the portion of said silicon dioxide layer in the bottom of said depression.

9. A process as in claim 6 wherein said step of forming insulating material in the bottom of said first and second trenches is accomplished by the steps of:
   implanting dopant ions into the bottom of said depression;
   forming a layer of silicon dioxide on the surface of said depression by thermal oxidation; and
   etching said layer of silicon dioxide to completely remove the portions of said silicon dioxide layer on the sides of said depression but not completely remove the portion of said silicon dioxide layer in the bottom of said depression.

10. A process as in claim 9 wherein said dopant ion is boron difluoride.

11. A process for fabricating a bipolar transistor, comprising the steps of:
    providing a substrate having a first region of a first conductivity type serving as a collector;
    etching a depression into said first region;
    forming an insulating layer in the bottom of said depression;
    filling said depression with a semiconductive material;
    forming a second region having a second conductivity type in said first region adjacent to said depression, said second region serving as a base;
    forming a third region of said first conductivity type serving as an emitter in said second region; and
    then implanting dopant ions into said semiconductive material.

12. A process as in claim 11 further including the step of annealing said implanted of dopant ions.

13. A process as in claim 11 wherein said semiconductive material is crystalline silicon.

14. A process as in claim 11 wherein said step of forming insulating material in the bottom of said first and second trenches is accomplished by the steps of:
    implanting dopant ions into the bottom of said depression;
    forming a layer of silicon dioxide on the surface of said depression by thermal oxidation; and
    etching said layer of silicon dioxide to completely remove the portions of said silicon dioxide layer on the sides of depression but not completely remove the portion of said silicon dioxide layer in the bottom of said depression.

15. A process for forming a bipolar transistor, comprising the steps of:
    providing a crystalline semiconductor substrate having a first region of a first conductivity type serving as a collector;
    etching first and second trenches into said first region;
    forming insulating material in the bottom of said first and second trenches;

filling said first and second trenches with a conductive material;

forming a second region of a second conductivity type between said first and second trenches;

forming a third region of said first conductivity type in said second region; and then implanting dopant ions into said conductive material.

16. A process as in claim 15 wherein said step of forming insulating material in the bottom of said first and second trenches is accomplished by the steps of:

implanting dopant ions into the bottom of said trenches;

forming a layer of silicon dioxide on the surface of said trenches by thermal oxidation; and etching said layer of silicon dioxide to completely remove the portions of said silicon dioxide layer on the sides of said trenches but not completely remove the portion of said silicon dioxide layer in the bottom of said trenches.

17. A process for forming a bipolar transistor, comprising the steps of:

forming a trench surronding an active area in a substrate, said substrate serving as a collector;

forming an insulating layer in the bottom of said trench;

forming a conductive region in said trench;

forming an insulating cap on the surface of said conductive material in said trench;

implanting dopant ions into said active region to form an instrinsic base;

implanting dopant ions into said active region to form an emitter;

forming a layer of conductive material on the surface of said substrate above said active region;

etching through said insulating to said conductive region using said layer of conductive material as an etching mask; and implanting dopant ions into said conductive region and annealing said substrate to cause said dopant ions to partially diffuse into said active region to form an extrinsic base.

18. A process as in claim 17 further comprising the step of: forming sidewall oxide layers on the sides of said layer of conductive material.

* * * * *